(12) United States Patent
Zhang et al.

(10) Patent No.: US 11,127,363 B2
(45) Date of Patent: Sep. 21, 2021

(54) GOA CIRCUIT, DISPLAY PANEL AND DISPLAY DEVICE

(71) Applicant: WUHAN CHINA STAR OPTOELECTRONICS TECHNOLOGY CO., LTD., Hubei (CN)

(72) Inventors: Xin Zhang, Hubei (CN); Juncheng Xiao, Hubei (CN); Chao Tian, Hubei (CN); Yanqing Guan, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 506 days.

(21) Appl. No.: 16/302,678

(22) PCT Filed: Aug. 16, 2018

(86) PCT No.: PCT/CN2018/100825
§ 371 (c)(1),
(2) Date: Nov. 19, 2018

(87) PCT Pub. No.: WO2020/019381
PCT Pub. Date: Jan. 30, 2020

(65) Prior Publication Data
US 2021/0225311 A1    Jul. 22, 2021

(30) Foreign Application Priority Data
Jul. 26, 2018    (CN) .......................... 201810835446.4

(51) Int. Cl.
*G09G 3/36*    (2006.01)

(52) U.S. Cl.
CPC ... *G09G 3/3677* (2013.01); *G09G 2300/0408* (2013.01); *G09G 2310/0283* (2013.01); *G09G 2310/08* (2013.01)

(58) Field of Classification Search
None
See application file for complete search history.

(56) References Cited

U.S. PATENT DOCUMENTS 10,885,862 B2 *   1/2021   Zhang ................. G09G 3/3696
2012/0086477 A1   4/2012   Sato et al.
(Continued)

FOREIGN PATENT DOCUMENTS

CN    104505042 A    4/2015
CN    105321491 A    2/2016
(Continued)

*Primary Examiner* — Ifedayo B Iluyomade
(74) *Attorney, Agent, or Firm* — Soroker Agmon Nordman

(57) ABSTRACT

A gate driver on array (GOA) circuit, a liquid crystal panel comprising the GOA circuit, and a display device including the liquid crystal panel are provided. The GOA circuit comprises a forward and backward scanning control module configured to control the GOA circuit to perform forward scan or backward scan according to a forward scanning signal or a backward scanning signal respectively, a first voltage stabilizing module configured to maintain a voltage level of a first node, and a second voltage stabilizing module electrically connecting to the forward and backward scanning control module, and configured to maintain a voltage level of an output signal of the forward and backward scanning control module.

19 Claims, 3 Drawing Sheets

(56) References Cited

U.S. PATENT DOCUMENTS

2017/0140728 A1 5/2017 Zhao et al.
2018/0033388 A1 2/2018 Gong

FOREIGN PATENT DOCUMENTS

| CN | 105469754 A | 4/2016 |
| CN | 107731195 A | 2/2018 |
| CN | 108010495 A | 5/2018 |

* cited by examiner

GOA CIRCUIT, DISPLAY PANEL AND DISPLAY DEVICE

CROSS REFERENCE TO RELATED APPLICATION

This application claims the priority of International Application No. PCT/CN2018/100825, filed on 2018 Aug. 16, which claims priority to Chinese Application No. 201810835446.4, filed on 2018 Jul. 26. The entire disclosures of each of the above applications are incorporated herein by reference.

BACKGROUND OF INVENTION

Field of Invention

The present invention relates to the field of display technologies, and more particularly to a GOA circuit, a display panel, and a display device.

Description of Prior Art

At present, liquid crystal display devices have been widely used in various electronic products, and a Gate Driver On Array (GOA) circuit is an important part of the liquid crystal display device, which is a technology that integrating a Gate scanning driving signal circuit on an Array substrate by utilizing a conventional array process of the thin film transistor liquid crystal display, thereby realizing a sequential scan driving for gate circuit.

According to the type of thin film transistor (TFT) used in the panel based on a low temperature polysilicon (LTPS) technology, the panel can be classified into the types of NMOS type, PMOS type, and CMOS type having both NMOS and PMOS TFTs. Similarly, GOA circuits are classified into NMOS circuits, PMOS circuits, and CMOS circuits. Compared with CMOS circuits, NMOS circuits help to improve product yield and reduce cost by eliminating a P-doped mask and process. The carriers in NMOS TFT are electrons, which have a higher mobility, and the device of NMOS TFT is relatively easy to be damaged compared with PMOS TFT (carriers in which are electron holes), the reliability of panel under a high temperature environment is insufficient, so that the phenomenon of GOA failure and screen separation are prone to occur, especially an In-cell Touch Panel (ITP), which is more likely to occur a screen separation at the touch period (TP) suspension stage.

At present, the ITP panel usually needs to insert a plurality of touch periods (TP Term) in one frame for implementing a touch sensing function, however, the NMOS GOA maintains a high voltage level required for the voltage level transfer through the capacitance of Q point, because the TFT is not an ideal device, which has a certain leakage current even in the off state; if the TP Term lasts for a long time, the TP suspension stage needs to remain high voltage level for a long time, which reduces stage transmittance circuit stability of GOA.

Therefore, it is necessary to provide a GOA circuit, a display panel, and a display device to solve the problems of the prior art.

SUMMARY OF THE INVENTION

The purpose of the present disclosure is to provide a GOA circuit, a display panel, and a display device, which could improve the stability of stage transmittance circuit.

In order to solve the above technique problems, the present disclosure provides a gate driver on array (GOA) circuit comprising m stages cascaded GOA units. A nth stage GOA unit comprises: a forward and backward scanning control module, a node signal control module, an output control module, a first voltage stabilizing module, a first pull-down module, a second pull-down module, a third pull-down module, and a second voltage stabilizing module, wherein $m \geq n \geq 1$.

The forward and backward scanning control module is configured to control the GOA circuit to perform forward scan or backward scan according to a forward scanning signal or a backward scanning signal respectively.

The node signal control module is configured to control the GOA circuit to output a low voltage level gate driving signal during a non-working phase according to a (n+1)th stage clock signal and a (n−1)th stage clock signal.

The output control module is configured to control an output of a gate driving signal of a current stage according to a clock signal of the current stage.

The first voltage stabilizing module is configured to maintain a voltage level of a first node.

The first pull-down module is configured to pull down the voltage level of the first node.

The second pull-down module is configured to pull down a voltage level of a second node.

The third pull-down module is configured to pull down a voltage level of the gate driving signal of the current stage.

The second voltage stabilizing module electrically connects to the forward and backward scanning control module, and is configured to maintain a voltage level of an output signal of the forward and backward scanning control module.

The second voltage stabilizing module comprises a fourteenth thin film transistor, a gate and a source of the fourteenth thin film transistor are connected to each other, the source of the fourteenth thin film transistor is connected to the forward and backward scanning control module, and a drain of the fourteenth thin film transistor is connected to the first node.

A charge storage module is configured to store the charge of a third node, wherein the third node is a connection point between the output control module and the first voltage stabilizing module.

In the GOA circuit of the present disclosure, the charge storage module comprises a first capacitor, one end of the first capacitor is connected to the third node, and the other end of the first capacitor is connected to an output end of the output control module.

In the GOA circuit of the present disclosure, the output control module comprises a ninth thin film transistor, a gate of the ninth thin film transistor is connected to the third node, a source of the ninth thin film transistor is connected to the clock signal of the current stage, a drain of the ninth thin film transistors is respectively connected to the third pull-down module and the other end of the first capacitor.

In the GOA circuit of the present disclosure, the nth stage GOA unit further comprises a fourth pull-down module and a pull-up module.

The fourth pull-down module comprises a thirteenth thin film transistor, a gate of the thirteenth thin film transistor is connected to a second global signal, and a source of the thirteenth thin film transistor is connected to a constant low voltage level signal.

The pull-up module comprises an eleventh thin film transistor and a twelfth thin film transistor, a gate and a source of the eleventh thin film transistor are connected to each other, a gate of the twelfth thin film transistor and a gate of the eleventh thin film transistor are connected to a first global signal, a source of the twelfth thin film transistor is connected to the constant low voltage level signal, a drain of the twelfth thin film transistor is connected to the second node, and a drain of the eleventh thin film transistor is connected to the drain of the ninth thin film transistor, a drain of a tenth thin film transistor and a drain of the thirteenth thin film transistor.

In the GOA circuit of the present disclosure, the forward and backward scanning control module comprises a first thin film transistor and a second thin film transistor.

A gate of the first thin film transistor is connected to a gate driving signal of a (n−2)th stage GOA unit, and a source of the first thin film transistor is connected to the forward scanning control signal;

A gate of the second thin film transistor is connected to a gate driving signal of a (n+2)th stage GOA unit, a source of the second thin film transistor is connected to the backward scanning control signal, and a drain of the second thin film transistor is respectively connected to the second pull-down module, the drain of the first thin film transistor and the source of the fourteenth thin film transistor.

In the GOA circuit of the present disclosure, the second pull-down module comprises a sixth thin film transistor, a gate of the sixth thin film transistor is connected to a drain of the second thin film transistor, a source of the sixth thin film transistor is connected to the constant low voltage level signal, and a drain of the sixth thin film transistor is connected to the second node.

In the GOA circuit of the present disclosure, the first pull-down module comprises a fifth thin film transistor, and a gate of the fifth thin film transistor is connected to the second node, a drain of the fifth thin film transistor is connected to the first node, and a source of the fifth thin film transistor is connected to the constant low voltage level signal.

In the GOA circuit of the present disclosure, the third pull-down module comprises a tenth thin film transistor, a gate of the tenth thin film transistor is connected to the second node, and a source of the tenth thin film transistor is connected to the constant low voltage level signal.

In the GOA circuit of the present disclosure, the nth stage GOA unit further comprises a second capacitor, one end of the second capacitor is connected to the second node, and the other end is connected to the constant low voltage level signal.

The present disclosure further provided a liquid crystal panel comprising a gate driver on array (GOA) circuit. The GOA circuit comprises m stages cascaded GOA units. A nth stage GOA unit comprises: a forward and backward scanning control module, a node signal control module, an output control module, a first voltage stabilizing module, a first pull-down module, a second pull-down module, a third pull-down module, and a second voltage stabilizing module, wherein m≥n≥1.

The forward and backward scanning control module is configured to control the GOA circuit to perform forward scan or backward scan according to a forward scanning signal or a backward scanning signal respectively.

The node signal control module is configured to control the GOA circuit to output a low voltage level gate driving signal during a non-working phase according to a (n+1)th stage clock signal and a (n−1)th stage clock signal.

The output control module is configured to control an output of a gate driving signal of a current stage according to a clock signal of the current stage.

The first voltage stabilizing module is configured to maintain a voltage level of a first node.

The first pull-down module is configured to pull down a voltage level of the first node.

The second pull-down module is configured to pull down the voltage level of the second node.

The third pull-down module is configured to pull down a voltage level of the gate driving signal of the current stage.

The second voltage stabilizing module electrically connects to the forward and backward scanning control module, and is configured to maintain a voltage level of an output signal of the forward and backward scanning control module.

In the liquid crystal panel of the present disclosure, the second voltage stabilizing module comprises a fourteenth thin film transistor, a gate and a source of the fourteenth thin film transistor are connected to each other, a source of the fourteenth thin film transistor is connected to the forward and backward scanning control module, and a drain of the fourteenth thin film transistor is connected to the first node.

In the liquid crystal panel of the present disclosure, a charge storage module is configured to store the charge of a third node, and the third node is a connection point between the output control module and the first voltage stabilizing module.

In the liquid crystal panel of the present disclosure, the charge storage module comprises a first capacitor, one end of the first capacitor is connected to the third node, and the other end of the first capacitor is connected to an output end of the output control module.

In the liquid crystal panel of the present disclosure, the output control module comprises a ninth thin film transistor, a gate of the ninth thin film transistor is connected to the third node, a source of the ninth thin film transistors is connected to the clock signal of the current stage, a drain of the ninth thin film transistors is respectively connected to the third pull-down module and the other end of the first capacitor.

In the liquid crystal panel of the present disclosure, the nth stage GOA unit further comprises a fourth pull-down module and a pull-up module.

The fourth pull-down module comprises a thirteenth thin film transistor, a gate of the thirteenth thin film transistor is connected to a second global signal, and a source of the thirteenth thin film transistor is connected to a constant low voltage level signal.

The pull-up module comprises an eleventh thin film transistor and a twelfth thin film transistor, a gate and a source of the eleventh thin film transistor are connected to each other, a gate of the twelfth thin film transistor and a gate of the eleventh thin film transistor are connected to a first global signal, a source of the twelfth thin film transistor is connected to the constant low voltage level signal, a drain of the twelfth thin film transistor is connected to the second node, and a drain of the eleventh thin film transistor is connected to the drain of the ninth thin film transistor, a drain of a tenth thin film transistor and a drain of the thirteenth thin film transistor.

In the liquid crystal panel of the present disclosure, the forward and backward scanning control module comprises a first thin film transistor and a second thin film transistor.

A gate of the first thin film transistor is connected to a gate driving signal of a (n−2)th stage GOA unit, and a source of the first thin film transistor is connected to the forward scanning control signal.

A gate of the second thin film transistor is connected to a gate driving signal of a (n+2)th GOA unit, a source of the second thin film transistor is connected to the backward scanning control signal, and a drain of the second thin film transistor is respectively connected to the second pull-down module, the drain of the first thin film transistor and the source of the fourteenth thin film transistor.

In the liquid crystal panel of the present disclosure, the second pull-down module comprises a sixth thin film transistor, a gate of the sixth thin film transistor is connected to the drain of the second thin film transistor, a source of the sixth thin film transistor is connected to a constant low voltage level signal, and a drain of the sixth thin film transistor is connected to the second node.

In the liquid crystal panel of the present disclosure, the first pull-down module comprises a fifth thin film transistor, and a gate of the fifth thin film transistor is connected to the second node.

A drain of the fifth thin film transistor is connected to the first node, and a source of the fifth thin film transistor is connected to the constant low voltage level signal.

In the liquid crystal panel of the present disclosure, the third pull-down module comprises a tenth thin film transistor, a gate of the tenth thin film transistor is connected to the second node, and a source of the tenth thin film transistor is connected to the constant low voltage level signal.

A display device comprises a liquid crystal panel, the liquid crystal panel comprises a gate driver on array (GOA) circuit, the GOA circuit comprises m stages cascaded GOA units, wherein a nth stage GOA unit comprises: a forward and backward scanning control module, a node signal control module, an output control module, a first voltage stabilizing module, a first pull-down module, a second pull-down module, a third pull-down module, a second voltage stabilizing module, wherein m≥n≥1.

The forward and backward scanning control module is configured to control the GOA circuit to perform forward scan or backward scan according to a forward scanning signal or a backward scanning signal respectively.

The node signal control module is configured to control the GOA circuit to output a low voltage level gate driving signal during a non-working phase according to a (n+1)th stage clock signal and a (n−1)th stage clock signal.

The output control module is configured to control an output of a gate driving signal of a current stage according to a clock signal of the current stage.

The first voltage stabilizing module is configured to maintain a voltage level of a first node;

The first pull-down module is configured to pull down the voltage level of the first node;

The second pull-down module is configured to pull down a voltage level of a second node.

The third pull-down module is configured to pull down a voltage level of the gate driving signal of the current stage.

The second voltage stabilizing module electrically connects to the forward and backward scanning control module, and is configured to maintain a voltage level of an output signal of the forward and backward scanning control module.

By adding a second voltage stabilizing module, the GOA circuit, the display panel and the display device of the present disclosure can prevent the signal of the forward and backward scanning control module's output end from leaking current through NT2 during screen touching period, thereby enhance the stability of the voltage level of Q2 and the reliability of the stage transmittance of the GOA circuit.

DETAILED DESCRIPTION OF PREFERRED EMBODIMENTS

Figure 1:
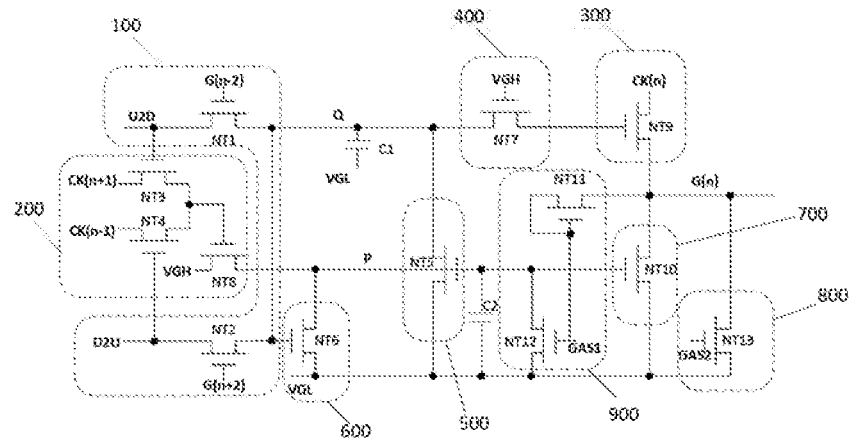
FIG. 1 is a schematic structural diagram of a conventional GOA circuit.

The following description of the various embodiments and reference drawings are provided to illustrate the specific embodiments of the disclosure. The directional terms mentioned in the present disclosure, such as "upper", "lower", "before", "after", "left", "right", "inside", "outside", "side", etc., are merely references to the attached figures. Therefore, the directional terminologies are used for the purpose of illustration and understanding of the disclosure, rather than limiting the invention. In the figures, structurally similar elements are denoted by the same reference numerals.

Referring to FIG. 1, the conventional GOA circuit comprises m stages cascaded GOA units, and a nth stage GOA unit comprises: a forward and backward scanning control module 100, a node signal control module 200, an output control module 300, a voltage stabilizing module 400, a first pull-down module 500, a second pull-down module 600, a third pull-down module 700, a fourth pull-down module 800, a pull-up module 900, and a first capacitor C1 and a second capacitor C2, wherein m≥n≥1.

The forward and backward scanning control module 100 is configured to control the GOA circuit to perform a forward scan or a backward scan according to a forward scan control signal U2D or a backward scanning control signal D2U. The node signal control module 200 is configured to control the GOA unit of a current stage to output a low voltage level gate driving signal during a non-working phase according to a clock signal CK(n+1) of a (n+1)th stage and a clock signal CK(n−1) of a (n−1)th stage. The output control module 300 is configured to control an output of the gate driving signal of the current stage according to a clock signal CK(n) of the current stage. The voltage stabilizing module 400 is configured to maintain a voltage level of a first node Q. The first pull-down module 500 is configured to pull down the voltage level of the first node Q. The second pull-down module 600 is configured to pull down a voltage level of a second node P. The third pull-down module 700 is configured to pull down a voltage level of a gate drive signal G(n) of the current stage. The fourth pull-down module 800 is configured to pull down the voltage level of the gate drive signal G(n) of the current stage according to a second global signal GAS2 when the display panel is in a second working state. The pull-up module 900 is configured to control the GOA unit of the current stage output a high voltage level gate driving signal according to a first global signal GAS1 when the display panel is in a first working state. The first working state is a working state of black screen touching working period or an abnormal power off period. It can be understood that when the display panel is in the first working state, the first global signal GAS1 is at a high voltage level, and all GOA units output a high voltage level gate driving signal. The second working state is a working state of display touching working period, at which period the second global signal GAS2 is at a high voltage level.

When the display panel is in a forward scanning state, the signal U2D is in high voltage level and the signal D2U is in low voltage level, the GOA circuit sequentially scans from top to bottom in this state. Conversely, when the display panel is in a backward scanning state, the signal U2D is in low voltage level and the signal D2U is in high voltage level, the GOA circuit sequentially scans from bottom to top in this state.

Figure 2:
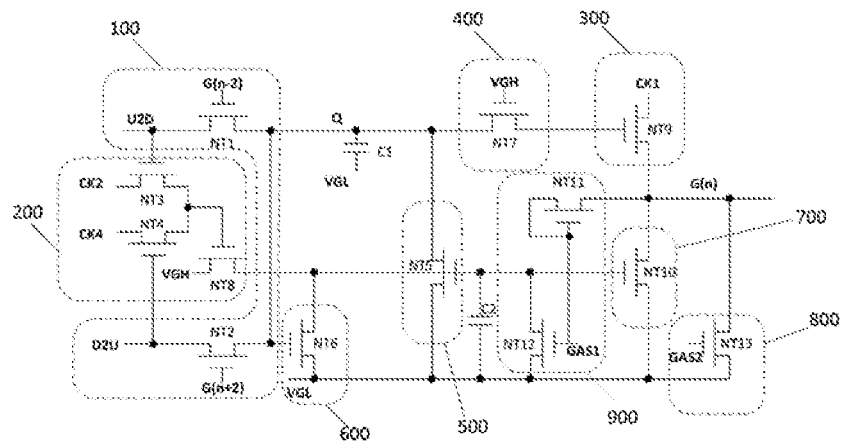
FIG. 2 is a schematic structural diagram of an nth stage GOA unit in a conventional GOA circuit.
Figure 3:
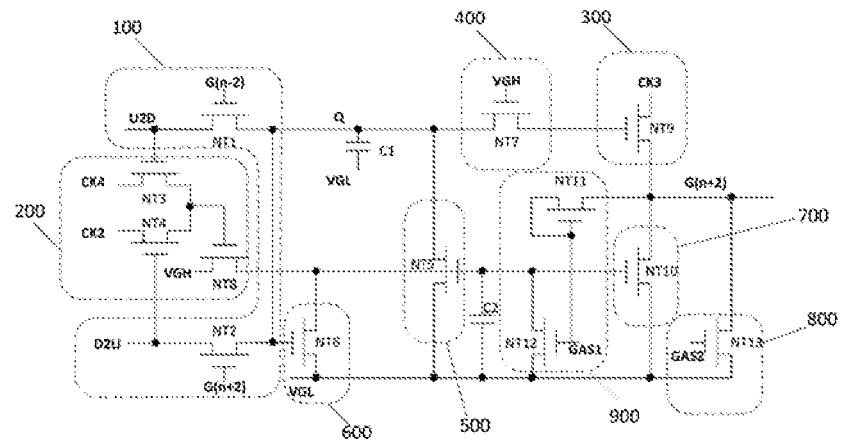
FIG. 3 is a schematic structural diagram of an (n+2)th GOA unit in a conventional GOA circuit.
Figure 4:
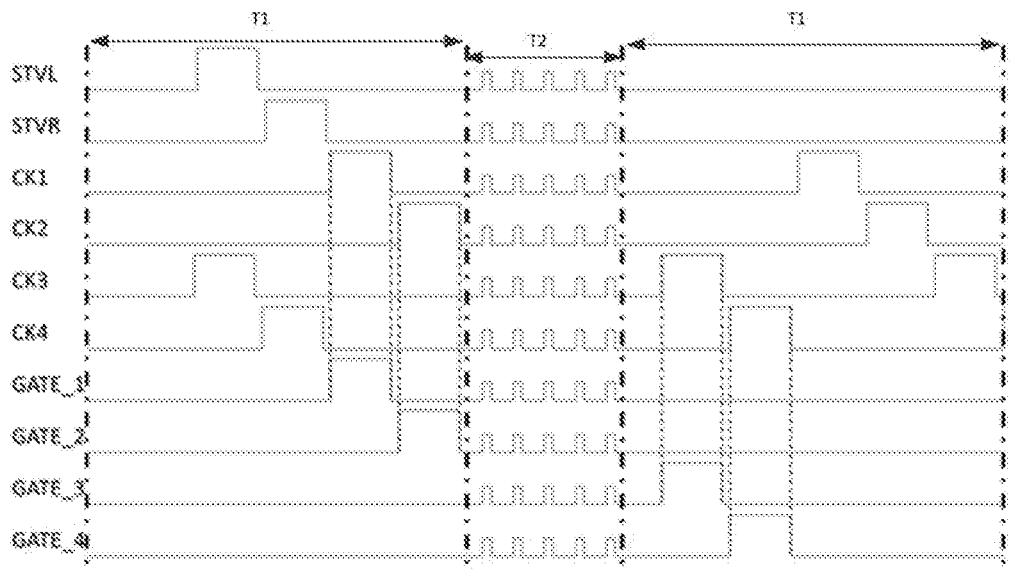
FIG. 4 is a timing diagram of a GOA circuit of a display panel of a conventional 4CK architecture.

If the display panel is a 4CK structure, the GOA circuit circulates with two basic units as a minimum repeating unit. As shown in FIGS. 2 and 3, the nth stage GOA unit and the (n+2)th stage GOA unit work together to constitute a GOA repeating unit. Referring to FIG. 4, there are four clock signals in the GOA circuit: from a 1st clock signal CK1 to a 4th clock signal CK4. When the nth stage clock signal of the nth stage GOA unit is the 1st clock signal CK1, the (n+1)th stage clock signal of the nth stage GOA unit is the 2nd clock signal CK2, and the (n−1)th stage clock signal of the nth stage GOA unit is the 4th clock signal CK4. When the nth stage clock signal of the (n+2)th stage GOA unit is the 3rd clock signal CK3, the (n+1)th stage clock signal of the (n+2)th stage GOA unit is the 4th clock signal CK4, and the (n−1)th stage clock signal of the (n+2)th stage GOA unit is the 2nd clock signal CK2. It can be understood that if the node signal control module 200 of the nth stage GOA unit is accesses in the 2nd and 4th clock signals, and the output control module 300 accesses the 1st clock signal, then the node signal control module 200 of the (n+1)th stage GOA unit accesses in the 1st and 3rd clock signals, and the output control module 300 accesses in the 2nd clock signal. Of course, the display panel can also use an 8CK structure, and the GOA circuit circulates with 4 basic units as the minimum repeating unit.

FIG. 4 is a timing diagram of a GOA circuit corresponding to a display panel of a 4CK structure; STVL and STVR signals are start signals, and the first global signal GAS1 and the second global signal GAS2 both keep a low voltage level when the display panel is working normally. The second global signal GAS2 is switched from a low voltage level to a high voltage level during a display period T1 to a touching sensing period T2.

Wherein GATE_1 to GATE_4 respectively indicates the 1st to 4th scanning signals, which correspond to the gate driving signals of the 1st to 4th stage GOA units respectively.

It can be understood that if the output control module 300 of the first stage GOA unit accesses the first clock signal, the output control module 300 of the second stage GOA unit accesses in the second clock signal. The output control module 300 of the third stage GOA unit accesses in the third clock signal, and output control module 300 of the fourth stage GOA unit accesses in the fourth clock signal. Therefore, when the signal CK1 is in high voltage level, G(1) is in high voltage level, thus GATE_1 is in high voltage level. The rest GATE_2 and GATE_4 are similar with above.

Backward referring to FIG. 1, during the TP Term period, the scanning line suspends the input of the scanning signal, which means, the output of the GOA unit corresponding to the suspending point of the scan line is suspended, at this time, the G(n−2) and the signal U2D of the GOA unit are at a high voltage level, and the node Q is at a high voltage level. Although the second thin film transistor NT2 is in the off state, a certain leakage current still exists, which reduces the stage transmittance stability of the GOA circuit and affects the operational stability of the GOA unit.

Figure 5:
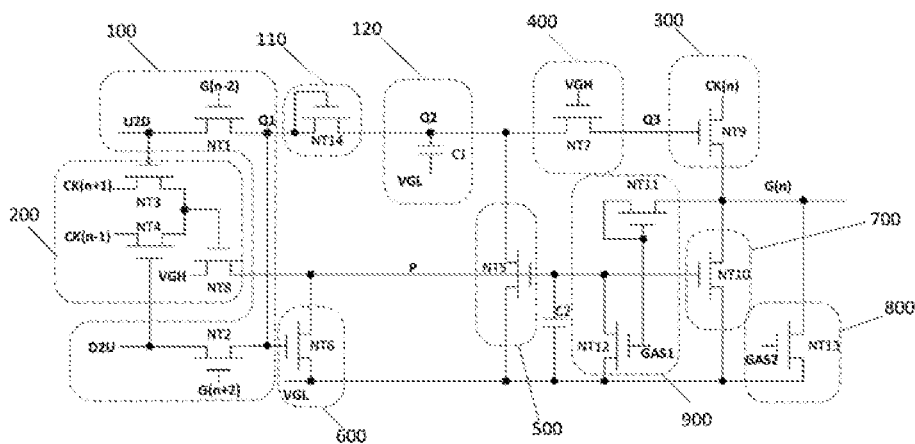
FIG. 5 is a schematic structural diagram of a GOA circuit according to a first embodiment of the present disclosure.

Referring to FIG. 5, FIG. 5 is a schematic structural diagram of a GOA circuit according to a first embodiment of the present disclosure.

As shown in FIG. 5, the GOA circuit of the embodiment of the present disclosure comprises m stages cascaded GOA units, a nth stage GOA unit comprises: a forward and backward scanning control module 100, a node signal control module 200, an output control module 300, a first voltage stabilizing module 400, a first pull-down module 500, a second pull-down module 600, a third pull-down module 700, and a second voltage stabilizing module 110, and a charge storage module 120, and further comprises a second capacitor C2, a fourth pull-down module 800 and a pull-up module 900, wherein m≥n≥1.

The first voltage stabilizing module 400 is configured to maintain a voltage level of a first node Q2.

The first pull-down module 500 is configured to pull down the voltage level of the first node Q2.

The second voltage stabilizing module 110 electrically connects to the forward and backward scanning control module, and is configured to maintain a voltage level of an output signal of the forward and backward scanning control module 100, which means maintain the voltage level of node Q1.

The charge storage module 120 configured to store the charge of the first node Q2.

The functions of the rest modules are the same as the functions thereof depicted in FIG. 1.

The second voltage stabilizing module 110 comprises a fourteenth thin film transistor NT14, a source of the fourteenth thin film transistor is connected to the forward and backward scanning control module 100, a gate and the source of the fourteenth thin film transistor are connected to each other, and a drain of the fourteenth thin film transistor is connected to the first node Q2. The first node Q2 is a connection point between the first voltage stabilizing module 400, the second voltage stabilizing module 110, and the first pull-down module 500.

The charge storage module 120 comprises a first capacitor C1, one end of the first capacitor C1 is connected to the first node Q2, and the other end of the first capacitor C1 is connected to the constant low voltage level signal VGL.

The forward and backward scanning control module 100 comprises a first thin film transistor NT1 and a second thin film transistor NT2, wherein a gate of the first thin film transistor NT1 is connected to a gate driving signal G(N−2) of an (N−2)th stage GOA unit, a source of the first thin film transistor NT1 is connected to the forward scanning control signal U2D.

A gate of the second thin film transistor NT2 is connected to the gate driving signal G(n+2) of the (n+2) stage GOA unit, the source of the second thin film transistor NT2 is connected to the backward scanning control signal D2U, and the drain of the second thin film transistor NT2 is respectively connected to the drain of the first thin film transistor NT1, the source of the fourteenth thin film transistor NT14 and the gate of the sixth thin film transistor NT6.

The second pull-down module 600 comprises a sixth thin film transistor NT6, a source of the sixth thin film transistor NT6 is connected to the constant low voltage level signal VGL, and a drain of the sixth thin film transistor NT6 is connected to the second node P.

The node signal control module 200 comprises a third thin film transistor NT3, a fourth thin film transistor NT4, and an eighth thin film transistor NT8. A gate of the third thin film transistor NT3 is connected to the forward scanning control signal U2D, and a source of the third thin film transistor NT3 is connected to the (n+1)th stage clock signal, a drain of the third thin film transistor NT3 is connected to a drain of the fourth thin film transistor NT4 and a gate of the eighth thin film transistor NT8. A gate of the fourth thin film transistor NT4 is connected to the backward scanning control signal DU2, and the source of the fourth thin film transistor NT4 is connected to the (n−1)th stage clock signal. A source of the eighth thin film transistor NT8 is connected to the constant high voltage level signal VGH, and the drain of the eighth thin film transistor NT8 is connected to the second node P.

The first voltage stabilizing module 400 comprises a seventh thin film transistor NT7. A gate of the seventh thin film transistor NT7 is connected to the constant high voltage level signal VGH, a source of the seventh thin film transistor NT7 is connected to the first node Q2, and the drain of the seventh thin film transistor NT7 is connected to the third node Q3.

The first pull-down module 500 comprises a fifth thin film transistor NT5. A gate of the fifth thin film transistor NT5 is connected to the second node, a drain of the fifth thin film transistor NT5 is connected to the first node Q2, and the source of the fifth thin film transistor NT5 is connected to the constant low voltage level signal VGL.

The output control module 300 comprises a ninth thin film transistor NT9. A gate of the ninth thin film transistor NT9 is connected to the third node Q3, and the source of the ninth thin film transistor NT9 is connected to a clock signal CK(n) of the current stage.

The third pull-down module 700 comprises a tenth thin film transistor NT10. A gate of the tenth thin film transistor NT10 is connected to the second node P, and a source of the tenth thin film transistor NT10 is connected to the constant low voltage level signal VGL.

The fourth pull-down module 800 comprises a thirteenth thin film transistor NT13. A gate of the thirteenth thin film transistor NT13 is connected to a second global signal GAS2, and a source of the thirteenth thin film transistor NT13 is connected to the constant low voltage level signal VGL.

The pull-up module 900 comprises an eleventh thin film transistor NT11 and a twelfth thin film transistor NT12. A gate and a source of the eleventh thin film transistor NT11 are connected, and the gates of the twelfth thin film transistor NT12 and the eleventh thin film transistor NT11 are connected into the first global signal GAS1, a source of the twelfth thin film transistor NT12 is connected to the constant low voltage level signal VGL, a drain of the twelfth thin film transistor NT12 is connected to the second node P, a drain of the eleventh thin film transistor NT11 is respectively connected to the drain of the ninth thin film transistor NT9, the drain of the tenth thin film transistor NT10, and the drain of the thirteenth thin film transistor NT13.

One end of the second capacitor C2 is connected to the second node P, and the other end of the second capacitor C2 is connected to the constant low voltage level signal VGL.

Figure 6:
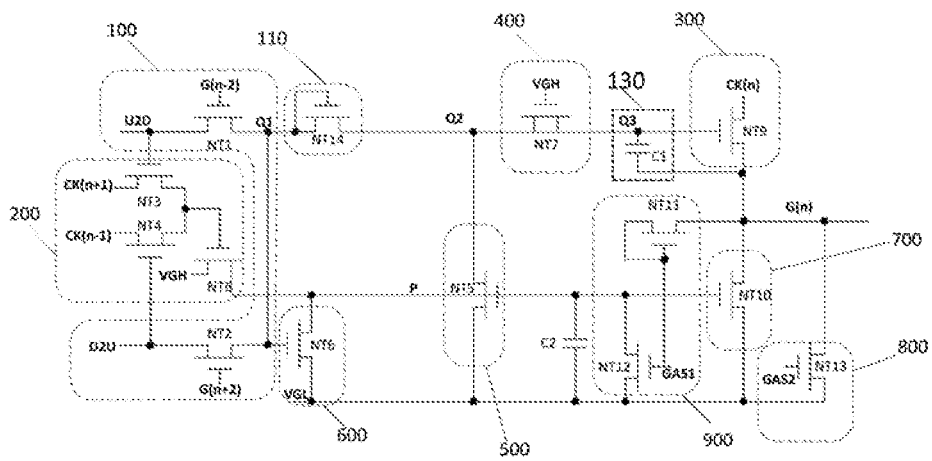
FIG. 6 is a schematic structural diagram of a GOA circuit according to a second embodiment of the present disclosure.

Referring to FIG. 6, FIG. 6 is a schematic structural diagram of a GOA circuit according to a second embodiment of the present disclosure.

The difference between this embodiment and the previous embodiment is illustrated as following.

The charge storage module 130 is configured to store the charge of the third node Q3, wherein the third node Q3 is a connection point between the output control module 300 and the first voltage stabilizing module 400. The charge storage module 130 comprises a first capacitor C1, one end of the first capacitor C1 is connected to the third node Q3, and the other end of the first capacitor C1 is connected to the drain of the ninth thin film transistor NT9.

The position changing of the first capacitor makes the increasing of the voltage level of Q3, which is advantageous for the output of G(n). For example, when the signal CK1 is in high voltage level, the ninth thin film transistor NT9 is in the off state, and the drain of the ninth thin film transistor NT9 is in high voltage level, which causes the voltage level of node Q3 to rise again.

Figure 7:
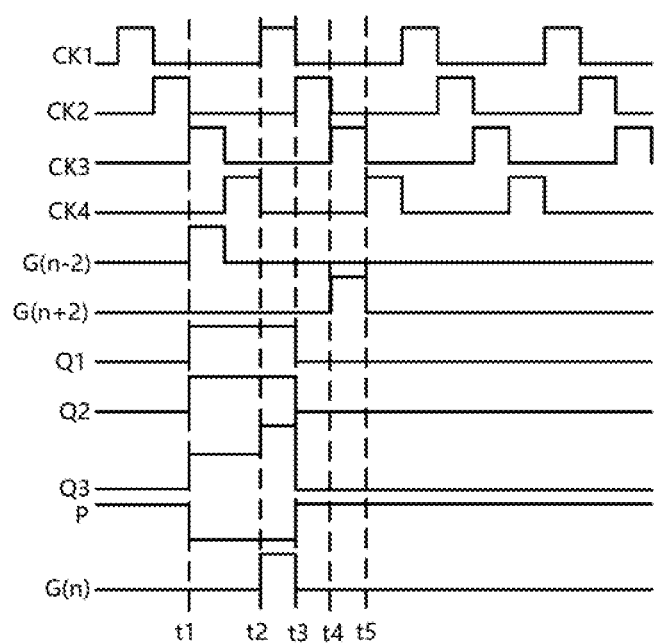
FIG. 7 is a timing diagram of the GOA circuit of FIG. 5 or 6.

As shown in FIG. 7, at time t1, when the signal G(n−2) is in high voltage level, nodes Q1, Q2, and Q3 are in high voltage level. At time t3, the rising edge of signal CK2 comes, the fifth thin film transistor NT5 is in the off state, and the voltage level of node Q2 is pulled down, since the voltage level of node Q2 is pulled down, the voltage level of node Q1 is also pulled down. At the same time, the seventh thin film transistor NT7 is in the off state, the voltage level of signal G(n) is pulled down, and the voltage level of node Q3 is correspondingly pulled down. During the period t2-t3, the signal CK1 is in high voltage level, the ninth thin film transistor NT9 is in the off state, and the drain of the ninth thin film transistor NT9 is in the high voltage level, that cause the voltage level of Q3 to rise again. The signal CK3 is at a high voltage level during the period of t4-t5, and the signal G(n+2) is at a high voltage level.

The GOA circuit of the present disclosure adds a second voltage stabilizing module, which equivalent to splitting the original node Q into two nodes Q1 and Q2, the one that plays the role of stage transmittance is node Q2, and node Q2 relative to the node Q in FIG. 1, the leakage path of second thin film transistor NT2 is eliminated, thereby preventing the signal of the output of the forward and backward scanning control module 100 from leaking through the second thin film transistor NT2 during screen touching, and enhancing the stability of the voltage level of node Q2. The requirement of the waveform of G(n−2) node in stage transmittance of the GOA circuit is reduced, and the reliability of the GOA circuit's sequential stage transmittance is enhanced. In addition, the influence brought by the panel display area on the GOA circuit's stage transmittance through the node G(n+2) is avoided, the screen flicker is avoided as well, and the reliability of the stage transmittance is enhanced.

The present disclosure further provides a display panel comprising any of the above GOA circuits. The display panel is, for example, a liquid crystal display panel.

The present disclosure further provides a display device including a display panel.

By adding a second voltage stabilizing module, the GOA circuit, the display panel and the display device of the present disclosure can prevent the signal of the forward and backward scanning control module's output end from leaking current through the second thin film transistor NT2 during screen touch sensing period, thereby enhance the stability of the voltage level of point Q2 and the reliability of the stage transmittance of the GOA circuit.

It should be understood that this disclosure is not limited to the foregoing description of the disclosed embodiments. Various changes and modifications can be made to the disclosure in light of the above detailed description by those skilled in the art. These changes and modifications are possible within the scope of the invention as defined by the following claims.

What is claimed is:

1. A gate driver on array (GOA) circuit, comprising m stages cascaded GOA units, wherein a nth stage GOA unit comprises:

a forward and backward scanning control module, a node signal control module, an output control module, a first voltage stabilizing module, a first pull-down module, a second pull-down module, a third pull-down module, and a second voltage stabilizing module, wherein m≥n≥1;

wherein the forward and backward scanning control module is configured to control the GOA circuit to perform forward scan or backward scan according to a forward scanning signal or a backward scanning signal respectively;

wherein the node signal control module is configured to control the GOA circuit to output a low voltage level gate driving signal during a non-working phase according to a (n+1)th stage clock signal and a (n−1)th stage clock signal;

wherein the output control module is configured to control an output of a gate driving signal of a current stage according to a clock signal of the current stage;

wherein the first voltage stabilizing module is configured to maintain a voltage level of a first node;

wherein the first pull-down module is configured to pull down the voltage level of the first node;

wherein the second pull-down module is configured to pull down a voltage level of a second node;

wherein the third pull-down module is configured to pull down a voltage level of the gate driving signal of the current stage;

wherein the second voltage stabilizing module electrically connects to the forward and backward scanning control module, and is configured to maintain a voltage level of an output signal of the forward and backward scanning control module;

wherein the second voltage stabilizing module comprises a fourteenth thin film transistor, a gate and a source of the fourteenth thin film transistor are connected to each other, the source of the fourteenth thin film transistor is connected to the forward and backward scanning control module, and a drain of the fourteenth thin film transistor is connected to the first node; and a charge storage module configured to store the charge of a third node; wherein the third node is a connection point between the output control module and the first voltage stabilizing module.

2. The GOA circuit according to claim 1, wherein, the charge storage module comprises a first capacitor, one end of the first capacitor is connected to the third node, and the other end of the first capacitor is connected to an output end of the output control module.

3. The GOA circuit according to claim 2, wherein, the output control module comprises a ninth thin film transistor, a gate of the ninth thin film transistor is connected to the third node, a source of the ninth thin film transistor is connected to the clock signal of the current stage, a drain of the ninth thin film transistors is respectively connected to the third pull-down module and the other end of the first capacitor.

4. The GOA circuit according to claim 3, wherein, the nth stage GOA unit further comprises a fourth pull-down module and a pull-up module;

the fourth pull-down module comprises a thirteenth thin film transistor, a gate of the thirteenth thin film transistor is connected to a second global signal, and a source of the thirteenth thin film transistor is connected to a constant low voltage level signal;

the pull-up module comprises an eleventh thin film transistor and a twelfth thin film transistor, a gate and a source of the eleventh thin film transistor are connected to each other, a gate of the twelfth thin film transistor and a gate of the eleventh thin film transistor are connected to a first global signal, a source of the twelfth thin film transistor is connected to the constant low voltage level signal, a drain of the twelfth thin film transistor is connected to the second node, and a drain of the eleventh thin film transistor is connected to the drain of the ninth thin film transistor, a drain of a tenth thin film transistor, and a drain of the thirteenth thin film transistor.

5. The GOA circuit according to claim 1, wherein, the forward and backward scanning control module comprises a first thin film transistor and a second thin film transistor;

a gate of the first thin film transistor is connected to a gate driving signal of a (n−2)th stage GOA unit, and a source of the first thin film transistor is connected to the forward scanning control signal;

a gate of the second thin film transistor is connected to a gate driving signal of a (n+2)th GOA unit, a source of the second thin film transistor is connected to a backward scanning control signal, and a drain of the second thin film transistor is respectively connected to the second pull-down module, the drain of the first thin film transistor, and the source of the fourteenth thin film transistor.

6. The GOA circuit according to claim 5, wherein, the second pull-down module comprises a sixth thin film transistor, a gate of the sixth thin film transistor is connected to a drain of the second thin film transistor, a source of the sixth thin film transistor is connected to a constant low voltage level signal, and a drain of the sixth thin film transistor is connected to the second node.

7. The GOA circuit according to claim 1, wherein, the first pull-down module comprises a fifth thin film transistor, and a gate of the fifth thin film transistor is connected to the second node;

a drain of the fifth thin film transistor is connected to the first node, and a source of the fifth thin film transistor is connected to a constant low voltage level signal.

8. The GOA circuit according to claim 1, wherein, the third pull-down module comprises a tenth thin film transistor, a gate of the tenth thin film transistor is connected to the second node, and a source of the tenth thin film transistor is connected to a constant low voltage level signal.

9. The GOA circuit according to claim 1, wherein, the nth stage GOA unit further comprises a second capacitor, one end of the second capacitor is connected to the second node, and the other end is connected to a constant low voltage level signal.

10. A liquid crystal panel comprising a gate driver on array (GOA) circuit, wherein the GOA circuit comprises m stages cascaded GOA units, wherein a nth stage GOA unit comprises:

a forward and backward scanning control module, a node signal control module, an output control module, a first voltage stabilizing module, a first pull-down module, a second pull-down module, a third pull-down module, a second voltage stabilizing module, wherein m≥n≥1;

wherein the forward and backward scanning control module is configured to control the GOA circuit to perform forward scan or backward scan according to a forward scanning signal or a backward scanning signal respectively;

wherein the node signal control module is configured to control the GOA circuit to output a low voltage level gate driving signal during a non-working phase according to a (n+1)th stage clock signal and a (n−1)th stage clock signal;

wherein the output control module is configured to control an output of a gate driving signal of a current stage according to a clock signal of the current stage;

wherein the first voltage stabilizing module is configured to maintain a voltage level of a first node;

wherein the first pull-down module is configured to pull down a voltage level of the first node;

wherein the second pull-down module is configured to pull down a voltage level of a second node;

wherein the third pull-down module is configured to pull down a voltage level of the gate driving signal of the current stage;

wherein the second voltage stabilizing module electrically connects to the forward and backward scanning control module, and is configured to maintain a voltage level of an output signal of the forward and backward scanning control module, wherein, the second voltage stabilizing module comprises a fourteenth thin film transistor, a gate and a source of the fourteenth thin film transistor are connected to each other, the source of the fourteenth thin film transistor is connected to the forward and backward scanning control module, and a drain of the fourteenth thin film transistor is connected to the first node.

11. The liquid crystal panel according to claim 10, wherein, a charge storage module configured to store the charge of a third node; wherein the third node is a connection point between the output control module and the first voltage stabilizing module.

12. The liquid crystal panel according to claim 11, wherein, the charge storage module comprises a first capacitor, one end of the first capacitor is connected to the third node, and the other end of the first capacitor is connected to an output end of the output control module.

13. The liquid crystal panel according to claim 12, wherein, the output control module comprises a ninth thin film transistor, a gate of the ninth thin film transistor is connected to the third node, a source of the ninth thin film transistors is connected to the clock signal of the current stage, a drain of the ninth thin film transistors is respectively connected to the third pull-down module and the other end of the first capacitor.

14. The liquid crystal panel according to claim 13, wherein, the nth stage GOA unit further comprises a fourth pull-down module and a pull-up module;

the fourth pull-down module comprises a thirteenth thin film transistor, a gate of the thirteenth thin film transistor is connected to a second global signal, and a source of the thirteenth thin film transistor is connected to a constant low voltage level signal;

the pull-up module comprises an eleventh thin film transistor and a twelfth thin film transistor, a gate and a source of the eleventh thin film transistor are connected to each other, a gate of the twelfth thin film transistor and the gate of the eleventh thin film transistor are connected to a first global signal, a source of the twelfth thin film transistor is connected to the constant low voltage level signal, a drain of the twelfth thin film transistor is connected to the second node, and a drain of the eleventh thin film transistor is connected to the drain of the ninth thin film transistor, a drain of a tenth thin film transistor, and a drain of the thirteenth thin film transistor.

15. The liquid crystal panel according to claim 13, wherein, the forward and backward scanning control module comprises a first thin film transistor and a second thin film transistor;

a gate of the first thin film transistor is connected to a gate driving signal of a (n−2)th stage GOA unit, and a source of the first thin film transistor is connected to the forward scanning control signal;

a gate of the second thin film transistor is connected to a gate driving signal of a (n+2)th GOA unit, a source of the second thin film transistor is connected to a backward scanning control signal, and a drain of the second thin film transistor is respectively connected to the second pull-down module, the drain of the first thin film transistor, and the source of the fourteenth thin film transistor.

16. The liquid crystal panel according to claim 10, wherein, the second pull-down module comprises a sixth thin film transistor, a gate of the sixth thin film transistor is connected to a drain of the second thin film transistor, a source of the sixth thin film transistor is connected to a constant low voltage level signal, and a drain of the sixth thin film transistor is connected to the second node.

17. The liquid crystal panel according to claim 10, wherein, the first pull-down module comprises a fifth thin film transistor, and a gate of the fifth thin film transistor is connected to the second node;

a drain of the fifth thin film transistor is connected to the first node, and a source of the fifth thin film transistor is connected to a constant low voltage level signal.

18. The liquid crystal panel according to claim 10, wherein, the third pull-down module comprises a tenth thin film transistor, a gate of the tenth thin film transistor is connected to the second node, and a source of the tenth thin film transistor is connected to a constant low voltage level signal.

19. A display device comprising a liquid crystal panel, wherein the liquid crystal panel comprises a gate driver on array (GOA) circuit, the GOA circuit comprises m stages cascaded GOA units, wherein a nth stage GOA unit comprises:

a forward and backward scanning control module, a node signal control module, an output control module, a first voltage stabilizing module, a first pull-down module, a second pull-down module, a third pull-down module, a second voltage stabilizing module, wherein m≥n≥1;

wherein the forward and backward scanning control module is configured to control the GOA circuit to perform forward scan or backward scan according to a forward scanning signal or a backward scanning signal respectively;

wherein the node signal control module is configured to control the GOA circuit to output a low voltage level gate driving signal during a non-working phase according to a (n+1)th stage clock signal and a (n−1)th stage clock signal;

wherein the output control module is configured to control an output of a gate driving signal of a current stage according to a clock signal of the current stage;

wherein the first voltage stabilizing module is configured to maintain a voltage level of a first node;

wherein the first pull-down module is configured to pull down the voltage level of the first node;

wherein the second pull-down module is configured to pull down a voltage level of a second node;

wherein the third pull-down module is configured to pull down a voltage level of the gate driving signal of the current stage;

wherein the second voltage stabilizing module electrically connects to the forward and backward scanning control module, and is configured to maintain a voltage level of an output signal of the forward and backward scanning control module, wherein, the second voltage stabilizing module comprises a fourteenth thin film transistor, a gate and a source of the fourteenth thin film transistor are connected to each other, the source of the fourteenth thin film transistor is connected to the forward and backward scanning control module, and a drain of the fourteenth thin film transistor is connected to the first node.

* * * * *